(12) United States Patent
Maeda

(10) Patent No.: US 7,671,424 B2
(45) Date of Patent: Mar. 2, 2010

(54) POWER MOSFET, SEMICONDUCTOR DEVICE INCLUDING THE POWER MOSFET, AND METHOD FOR MAKING THE POWER MOSFET

(75) Inventor: Hiroki Maeda, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/857,054

(22) Filed: Sep. 18, 2007

(65) Prior Publication Data
US 2008/0073712 A1 Mar. 27, 2008

(30) Foreign Application Priority Data
Sep. 27, 2006 (JP) ............... 2006-263430

(51) Int. Cl.
*H01L 27/092* (2006.01)
(52) U.S. Cl. .......... 257/400; 257/394; 257/376; 257/372; 257/E27.063; 438/197
(58) Field of Classification Search .......... 257/372, 257/373, 376, 394, 400, E27.063; 438/197
See application file for complete search history.

(56) References Cited

U.S. PATENT DOCUMENTS

| 5,436,183 | A * | 7/1995 | Davis et al. ........... 438/200 |
| 6,797,594 | B2 * | 9/2004 | Hoshino et al. ........ 438/520 |
| 6,977,425 | B2 * | 12/2005 | Yoshida et al. ........ 257/517 |
| 7,595,244 | B1 * | 9/2009 | Bulucea et al. ........ 438/290 |
| 2003/0062537 | A1 * | 4/2003 | Sugii et al. ........... 257/192 |
| 2007/0170516 | A1 * | 7/2007 | Cecchi et al. .......... 257/371 |
| 2008/0128711 | A1 * | 6/2008 | Okuno et al. ........... 257/77 |

FOREIGN PATENT DOCUMENTS

| JP | 59-181529 | 10/1984 |
| JP | 01-120067 | 5/1989 |
| JP | 04-256355 | 9/1992 |
| JP | 05-259444 | 10/1993 |
| JP | 11-298000 | 10/1999 |
| JP | 2003-249645 | 9/2003 |

OTHER PUBLICATIONS

Japanese Office Action issued on Nov. 25, 2008, corresponding to Japanese Patent Application No. 2006-263430.

\* cited by examiner

*Primary Examiner*—Victor A Mandala
(74) *Attorney, Agent, or Firm*—Sonnenschein Nath & Rosenthal LLP

(57) ABSTRACT

A metal oxide semiconductor field effect transistor includes a semiconductor substrate; a well region containing an impurity of a first conductivity type disposed on the semiconductor substrate, the well region including a source region and a drain region formed by adding an impurity of a second conductivity type, the source region and the drain region being separated from each other by a predetermined gap; an insulating film disposed on the surface of the well region in the gap between the source region and the drain region; and a gate electrode disposed on the insulating film. The well region is composed of an epitaxial layer, and the epitaxial layer includes an impurity layer of the first conductivity type having a different impurity concentration.

5 Claims, 9 Drawing Sheets

FIG. 7

| DEVICE | WELL REGION ION IMPLANTATION | WELL REGION THERMAL DIFFUSION | WELL REGION P+ EPi | UIS Id (A) |
|---|---|---|---|---|
| POWER MOSFET 100 OF THE RELATED ART | 60 keV 2.20E+13 | 800°C 10 min H$_2$/O$_2$ 40 nm | ABSENT | 2 A |
| POWER MOSFET 10 OF THE EMBODIMENT | NOT PERFORMED | NOT PERFORMED | PRESENT | 22 A |

POWER MOSFET, SEMICONDUCTOR DEVICE INCLUDING THE POWER MOSFET, AND METHOD FOR MAKING THE POWER MOSFET

CROSS REFERENCES TO RELATED APPLICATIONS

The present invention contains subject matter related to Japanese Patent Application JP 2006-263430 filed in the Japanese Patent Office on Sep. 27, 2006, the entire contents of which are incorporated herein by reference.

BACKGROUND OF THE INVENTION

1. Field of the Invention

The present invention relates to a metal oxide semiconductor field effect transistor (MOSFET), a semiconductor device including the MOSFET, and a method for making the MOSFET. In particular, it relates to a power MOSFET, a semiconductor device including the power MOSFET, and a method for making the power MOSFET.

2. Description of the Related Art

Power supplies of various electronic apparatuses have been provided with voltage transducers that increase or decrease the power supply voltage output from the power supplies according to the usage. These transducers have been provided with power MOSFETs that function as switching elements or the like configured to feed power supply voltage supplied from the power supply to various electrical circuits downstream by being turned ON or OFF based on predetermined control signals.

This power MOSFET is shown in FIG. 9A. As shown in FIG. 9A, a power MOSFET 100 includes a semiconductor substrate 101; a well region 103 of a first conductivity type formed by implanting ions of an impurity of a first conductivity type (P-type) into the semiconductor substrate 101 through an insulating film and then thermally diffusing the implanted ions; a source region 110a and a drain region 110b formed by implanting ions of an impurity of a second conductivity type (N-type) into the well region 103 such that the two regions are a predetermined distance away from each other; and a gate electrode 105 formed on a gate insulating film 104 on the surface of the well region 103 in the region between the source region 110a and the drain region 110b (for example, refer to Japanese Unexamined Patent Application Publication No. 11-298000). The power MOSFET also includes lightly doped drain (LDD) regions 108.

The power MOSFET 100 is configured such that by applying a predetermined control signal (gate voltage) to the gate electrode 105, electrical current corresponding to the gate voltage flows between the source region 110a and the drain region 110b.

This type of power MOSFET 100 is usually installed in a section involving relatively high voltage and relatively large electric current, such as power supplies as described above and is thus desired to achieve relatively high rated voltage and relatively high rated current.

One of the means for evaluating the rated voltage and the rated current is unclamped inductive switching (UIS) that indicates avalanche resistance.

In order to conduct evaluation by UIS, as shown in FIG. 9B, the power MOSFET 100 is first turned on to allow electric current Id to flow between the drain region 110b and the source region 110a while connecting the drain region of the power MOSFET 100 to a power supply Vdd through a coil L.

By adjusting the length of time of holding the power MOSFET 100 ON, the value of the electric current Id can be controlled. The electric current Id increases with the length of time.

After the power MOSFET 100 is turned OFF, the electric current Id still keeps flowing because of the characteristics of the coil L. The power MOSFET 100 allows the electric current Id to continuously flow while undergoing avalanche breakdown. Then, after the energy stored in the coil L while the power MOSFET is being turned ON is completely released, the power MOSFET 100 enters a typical OFF-state in which electric current Id no longer flows between the source region 110a and the drain region 110b.

However, if the electric current Id is a particular value of more, avalanche breakdown no longer occurs in the power MOSFET 100, resulting in breaking of the power MOSFET.

This is attributable to the following mechanism. When the power MOSFET 100 is switched from the ON state to the OFF state, the electric current Id flows from the drain region 110b to the source region 110a due to the avalanche breakdown of the power MOSFET 100 for some while. During this process, an NPN-type bipolar transistor is parasitically formed by the N-type drain region 110b, the P-type well region 103 under the gate electrode 105, and the N-type source region 110a. When the value of the electric current Id is elevated to a predetermined level or more, a potential of a predetermined value of more is generated in the base (the well region 103 under the gate electrode) of this NPN-type bipolar transistor. This causes the NPN-type bipolar transistor to enter the ON state, and short-circuiting of the drain region 110b and the source region 110a occurs although no gate voltage is applied to the gate electrode 105 of the power MOSFET 100, thereby resulting in breaking of the power MOSFET 100.

In other words, the value of the electric current Id at the time of breaking of the power MOSFET 100 and the value of the voltage applied to the drain region 110b at this time are the rated current and the rated voltage of the power MOSFET 100, respectively.

SUMMARY OF THE INVENTION

The aforementioned power MOSFET 100 known in the art faces difficulties of increasing the rated current or rated voltage since the well region 103 is formed by implanting ions of an impurity of a first conductivity type into the semiconductor substrate 101 through an insulating film.

In other words, according to the power MOSFET 100 known in the art, because the well region 103 is formed by thermally diffusing the ions of an impurity of a first conductivity type implanted into the semiconductor substrate 101 through the insulating film, there may occur local variation in concentration of the impurity within the well region 103 due to the variation in thickness of the insulating film serving as a through film during ion plantation.

Moreover, boron (B) usually used as the impurity of a first conductivity type is susceptible to oxidation and nitriding and may partly react with the atmosphere in the high-temperature diffusion furnace where thermal diffusion is performed. This also renders the impurity concentration nonuniform within the well region 103, resulting in local variation in concentration in some cases.

Once local variation in concentration of the impurity occurs in the well region 103, the resistance of the base (the region under the gate electrode 105 in the well region 103) of the parasitically formed NPN-type bipolar transistor is increased. Thus, when evaluation by UIS is conducted, a potential large enough to turn the NPN-type bipolar transistor ON is generated in the base of the NPN-type bipolar transistor by a relatively small electric current Id or a relatively low voltage, thereby resulting in breaking of the power MOSFET 100. Thus, it has been difficult to improve the UIS characteristics of the power MOSFET 100.

A metal oxide semiconductor field effect transistor according to an embodiment of the present invention includes a semiconductor substrate; a well region containing an impurity of a first conductivity type disposed on the semiconductor substrate, the well region including a source region and a drain region formed by adding an impurity of a second conductivity type, the source region and the drain region being separated from each other by a predetermined gap; an insulating film disposed on the surface of the well region in the gap between the source region and the drain region; and a gate electrode disposed on the insulating film. The well region is composed of an epitaxial layer, and the epitaxial layer includes an impurity layer of the first conductivity type having a different impurity concentration.

According to this structure, because the impurity concentration of layers constituting the well region can be made uniform, and a local increase in resistance can be prevented in each of the layers constituting the well region, and the UIS characteristics of the power MOSFET can be improved.

Preferably, the impurity concentration of the impurity layer is higher than that in other layers of the well region.

In this manner, not only the impurity concentration of each of the layers constituting the well region can be made uniform but also the resistance of the region which serves as the base of an NPN-type bipolar transistor parasitically formed during evaluation by UIS can be reduced. This is because the impurity layer having a further lower resistance can be formed inside the well region. Thus, the UIS characteristics of the power MOSFET can be further improved.

More preferably, the impurity layer is connected to the source region through an impurity region of a first conductivity type having an impurity concentration higher than that in the well region other than the impurity layer.

In this manner, the difference in potential between the region which serves as the base of the parasitically formed NPN-type bipolar transistor during evaluation by UIS and the region which serves as an emitter can be reduced, and the NPN-type bipolar transistor is prevented from being turned ON at a relatively low voltage or current. Thus, the UIS characteristics of the power MOSFET can be improved.

A semiconductor device according to another embodiment of the present invention includes a metal oxide semiconductor field effect transistor including a semiconductor substrate; a well region containing an impurity of a first conductivity type disposed on the semiconductor substrate, the well region including a source region and a drain region formed by adding an impurity of a second conductivity type, the source region and the drain region being separated from each other by a predetermined gap; an insulating film disposed on the surface of the well region in the gap between the source region and the drain region; and a gate electrode disposed on the insulating film. The well region is composed of an epitaxial layer, and the epitaxial layer includes an impurity layer of the first conductivity type having a different impurity concentration.

According to this structure, since the impurity concentration of each of the layers constituting the well region of the power MOSFET can be made uniform, the resistance of each of the layers of the well region is prevented from increasing locally. Moreover, since the impurity layer having a resistance lower than that of other layers constituting the well region is formed, the UIS characteristics of the power MOSFET can be improved, and a semiconductor device with higher rated current and rated voltage can be provided.

A method for making a metal oxide semiconductor field effect transistor according to yet another embodiment of the present invention, the transistor including a semiconductor substrate; a well region containing an impurity of a first conductivity type disposed on the semiconductor substrate, the well region including a source region and a drain region formed by adding an impurity of a second conductivity type, the source region and the drain region being separated from each other by a predetermined gap; an insulating film disposed on the surface of the well region in the gap between the source region and the drain region; and a gate electrode disposed on the insulating film includes forming an epitaxial layer containing the impurity of a first conductivity type on the semiconductor substrate; and doping the epitaxial layer with the impurity of a first conductivity type to form an impurity layer of a first conductivity type having a different impurity concentration.

According to this method, the impurity concentration in each of the layers of the well region can be made uniform. Thus, the resistance of each layers of the well region can be prevented from increasing locally. Moreover, since the impurity layer having a resistance lower than that of other layers constituting the well region is formed, a power MOSFET with improved UIS characteristics can be made.

BRIEF DESCRIPTION OF THE DRAWINGS

FIG. 7 is a table showing the results of the comparison of between a power MOSFET of the related art and the power MOSFET shown in FIG. 1;

DESCRIPTION OF THE PREFERRED EMBODIMENTS

A power MOSFET incorporated in a semiconductor device according to an embodiment of the invention and a method for making the power MOSFET will now be described in detail with reference to the drawings.

Figure 1:
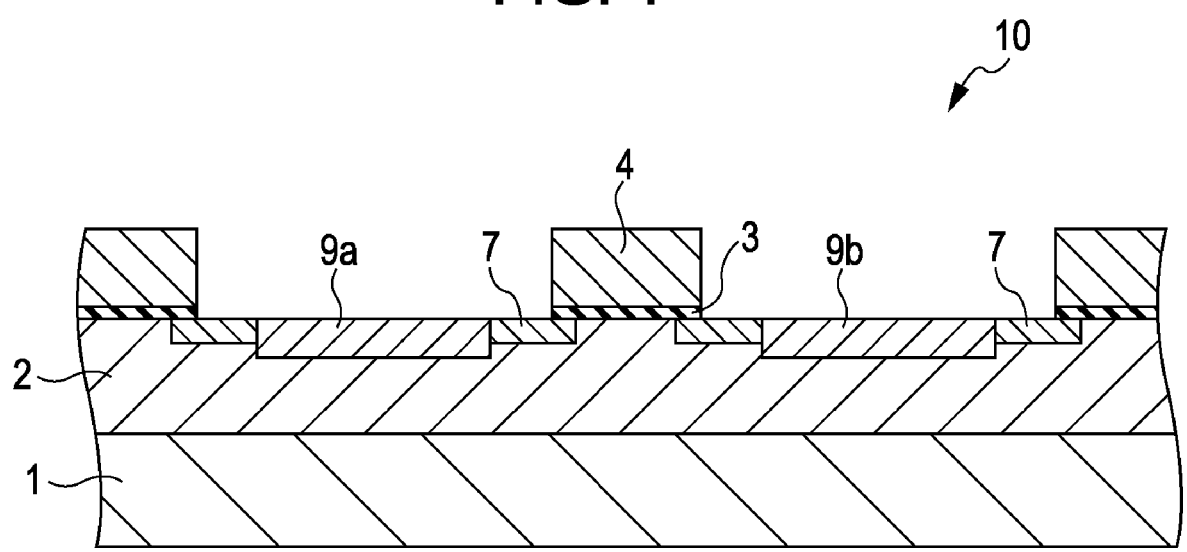
FIG. 1 is a cross-sectional view showing a power MOSFET incorporated in a semiconductor device according to an embodiment.

FIG. 1 is a cross-sectional view showing a power MOSFET incorporated in a semiconductor device according to an embodiment of the present invention, and FIGS. 2A to 3G are cross-sectional views for describing the process of making the power MOSFET. FIG. 4 is a cross-sectional view of a power MOSFET incorporated in a semiconductor device according to another embodiment of the present invention, and FIGS. 5A to 6H are cross-sectional views for describing the process of making the power MOSFET shown in FIG. 4.

Figure 8:
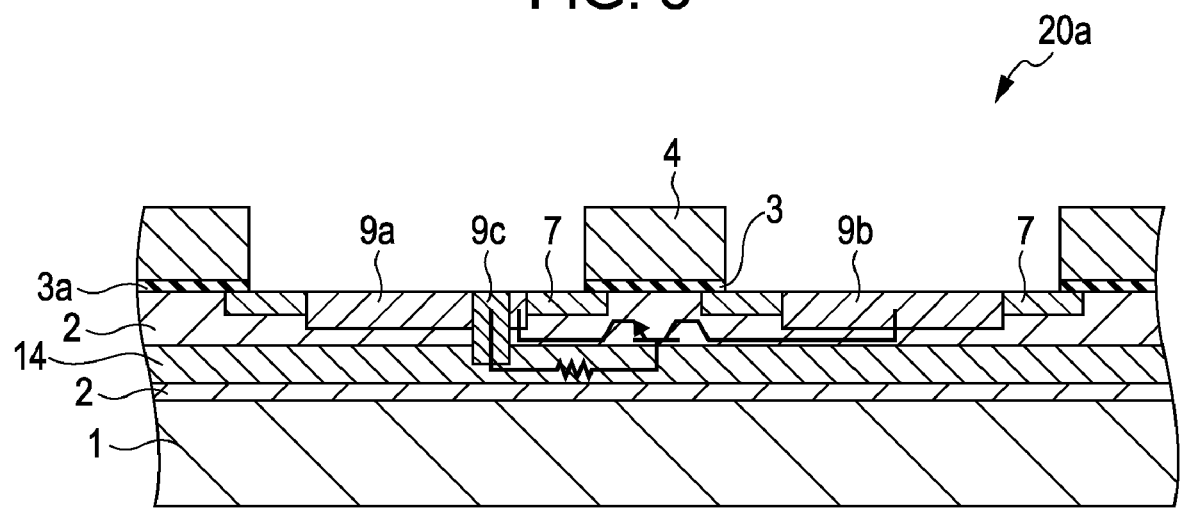
FIG. 8 is a cross-sectional view showing a modification of the power MOSFET shown in FIG. 4.
Figure 9A:
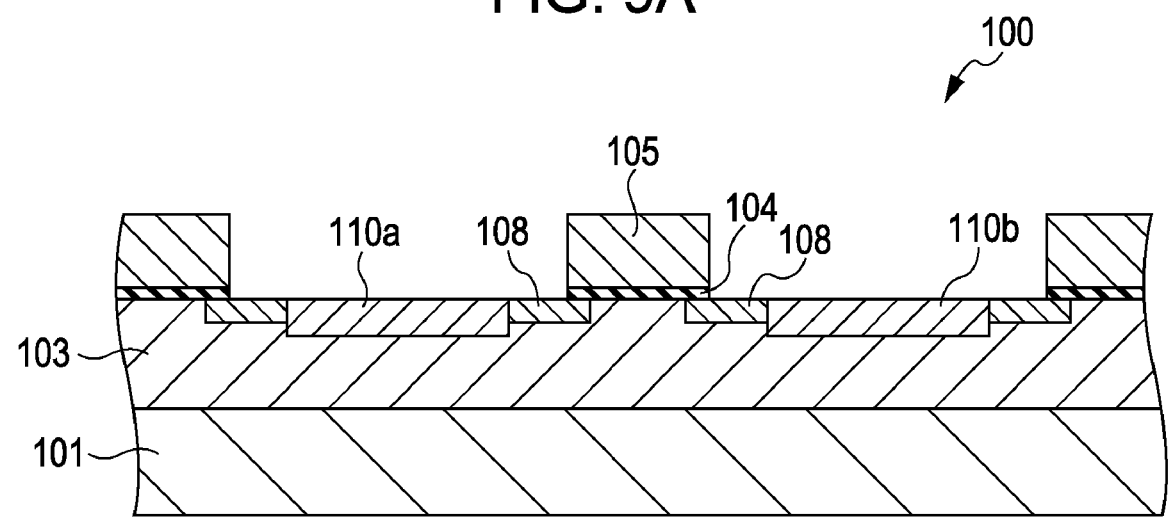
FIGS. 9A and 9B are cross-sectional view showing the power MOSFET of the related art.
Figure 9B:
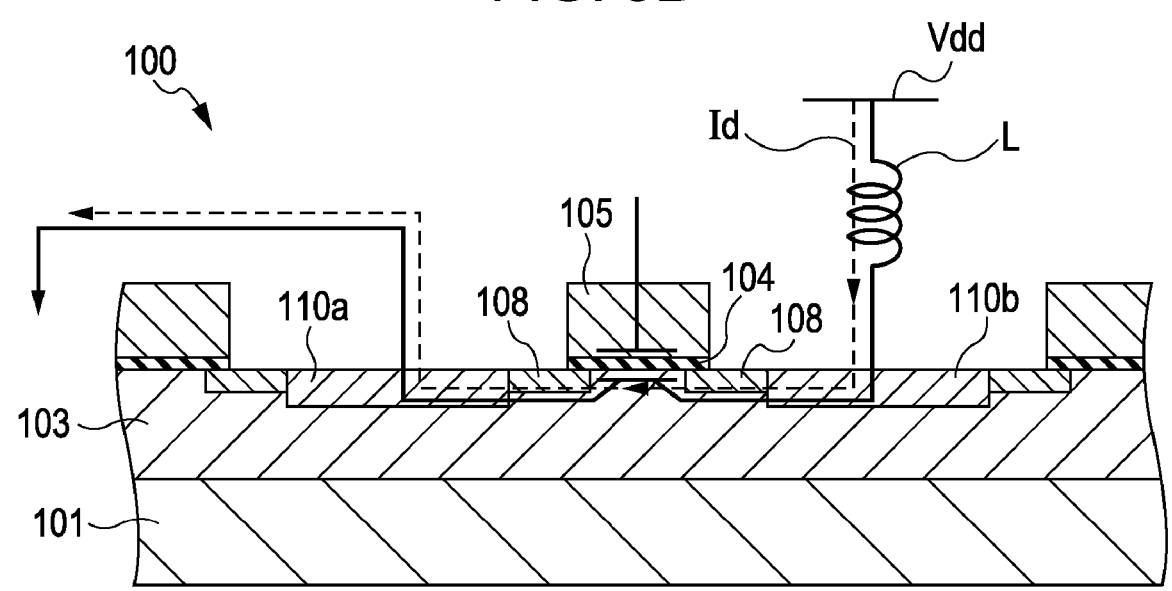

FIG. 7 is a table showing the results of comparison of UIS characteristics between the power MOSFET of the related art and the power MOSFET shown in FIG. 1. FIG. 8 shows a modification example of the power MOSFET shown in FIG. 4.

As shown in FIG. 1, a power MOSFET 10 incorporated in a semiconductor device according to an embodiment includes a silicon (Si) substrate 1, which is a semiconductor substrate containing an impurity of a first conductivity type at a relatively low impurity concentration, and a P-type well region 2, which is an epitaxial layer containing an impurity of a first conductivity type, i.e., boron (B), on the Si substrate 1.

The P-type well region 2 includes a source region 9a and a drain region 9b formed by adding (ion-implanting) arsenic (As), which is an impurity of a second conductivity type, the source region 9a and the drain region 9b being separated from each other by a predetermined gap.

A gate insulating film 3, which is a silicon oxide ($SiO_2$) film, is disposed on the surface of the P-type well region 2 in the gap between the source region 9a and the drain region 9b, and a gate electrode 4 is disposed on the gate insulating film 3. In FIG. 1, a lightly doped drain (LDD) region and a pocket implantation (PKT) region are indicated as one region denoted by reference numeral 7.

Because an epitaxial layer containing a P-type impurity is contained in the P-type well region 2 of the power MOSFET 10 of this embodiment, the impurity concentration within the P-type well region 2 is uniform, and the resistance in the P-type well region 2 is also uniform.

When the power MOSFET 10 is evaluated by unclamped inductive switching (UIS), the power MOSFET 10 exhibits UIS characteristics superior to that of other power MOSFETs not having epitaxial layers as the well regions.

In other words, if the P-type well region 2 is an epitaxial layer, then the region under the gate electrode 4 serving as the base of the parasitically formed NPN-type bipolar transistor during evaluation by UIS lies in the epitaxial layer with uniform P-type dopant concentration. As a result, the region serving as the base of the parasitically formed NPN-type bipolar transistor becomes free of portions that locally exhibit high resistance, and the power MOSFET 10 of this embodiment is prevented from breaking even when electric current larger than the current that would break known power MOSFETs with no epitaxial layers as the well regions is supplied.

This indicates that the rated current and the rated voltage of the power MOSFET 10 of this embodiment are higher than those of the known power MOSFET in which the well region is not made of an epitaxial layer. The results of the evaluation of the power MOSFET 100 of the related art and the power MOSFET 10 of this embodiment by UIS shown in FIG. 7 clearly support this.

In the evaluation by UIS shown in FIG. 7, the power MOSFET 10 of this embodiment is compared with the power MOSFET 100 of the related art produced by implanting boron ions at a dosage of 2.20 E+13 ion/$cm^2$ into a semiconductor substrate by using 60 keV energy and conducting thermal diffusion treatment for 10 minutes in a 800° C. atmosphere to form a 40 nm-deep well region 103 in the semiconductor substrate.

As is apparent from FIG. 7, whereas the value of the current Id at which the power MOSFET 100 of the related art in which the well region is not made of an epitaxial layer breaks is 2 A, the value of the current Id at which the power MOSFET 10 of this embodiment breaks is as high as 22 A.

A method for making the power MOSFET 10 of this embodiment will now be described with reference to FIGS. 2A to 3G.

Figure 2A:
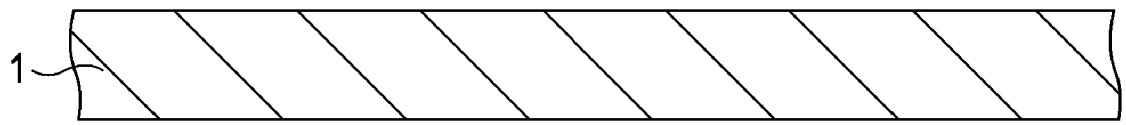
FIGS. 2A to 2C are cross-sectional views showing a process of making the power MOSFET.
Figure 2B:
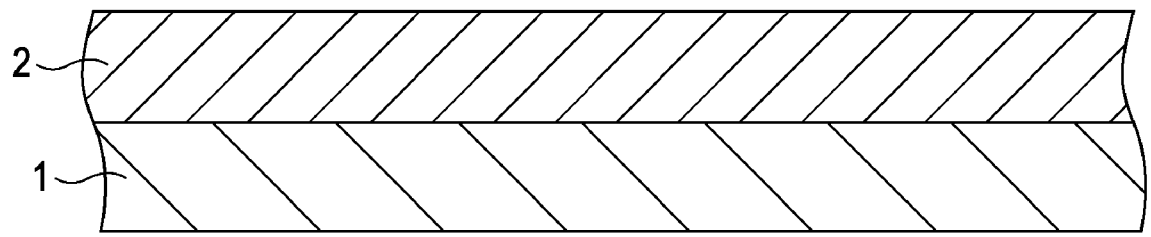

As shown in FIG. 2A, in order to make the power MOSFET 10, a Si substrate 1 containing a P-type impurity at a relatively low concentration is prepared, and the as shown in FIG. 2B, an epitaxial layer containing a P-type impurity at a concentration higher than the P-type impurity concentration in the Si substrate 1 is formed on the surface of the Si substrate 1 to form a P-type well region 2.

During this process, the P-type well region 2 is formed by gas-phase epitaxy using silicon as the material gas while supplying boron as the doping gas.

Subsequently, a $SiO_2$ film not show in the drawing is formed on the surface of the P-type well region 2 to set the threshold voltage that determines the switching characteristics of the power MOSFET 10 and then boron ions are implanted at a dosage of 5.00 E+12 ion/$cm^2$ into the P-type well region 2 through this $SiO_2$ film by using 70 keV energy.

Figure 2C:
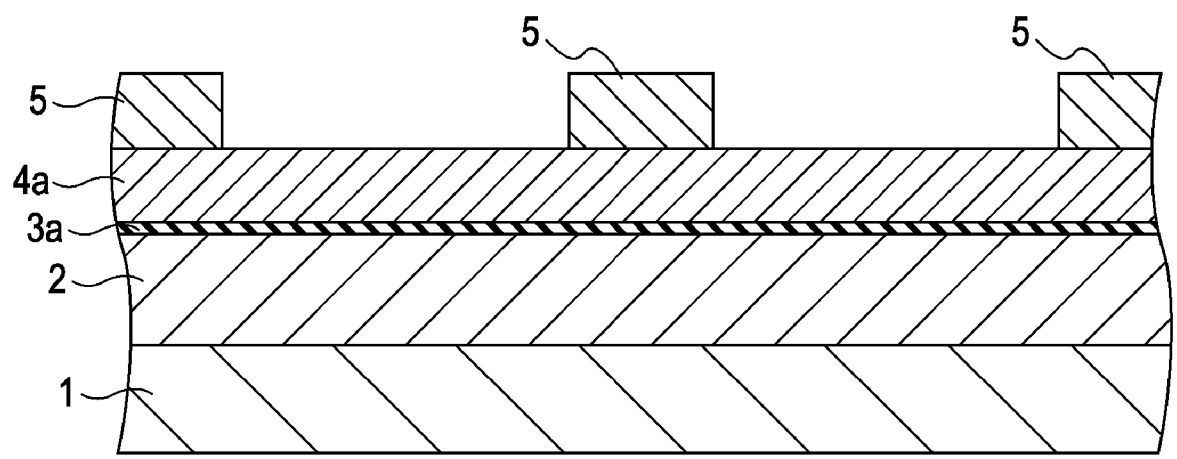

As shown in FIG. 2C, a $SiO_2$ film 3a which will make a gate insulating film 3 is formed on the surface of the well region 2 by chemical vapor deposition (CVD), and a polysilicon film 4a which will make a gate electrode 4 is formed on the surface of the $SiO_2$ film 3a also by CVD.

After a photoresist is applied on the surface of the polysilicon film 4a, the photoresist is photolithographically patterned to form a resist mask 5 on the surface of the polysilicon film 4a over parts where the gate electrodes 4 are made later.

Figure 3D:
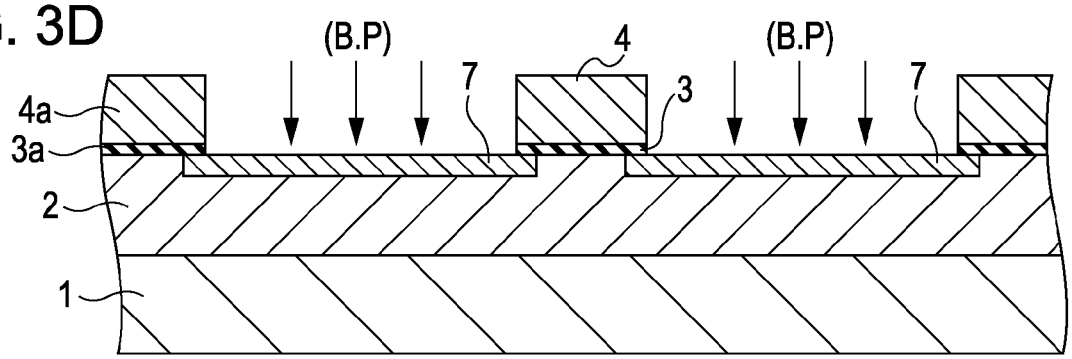
FIGS. 3D to 3G are cross-sectional views showing the process of making the power MOSFET.
Figure 3E:
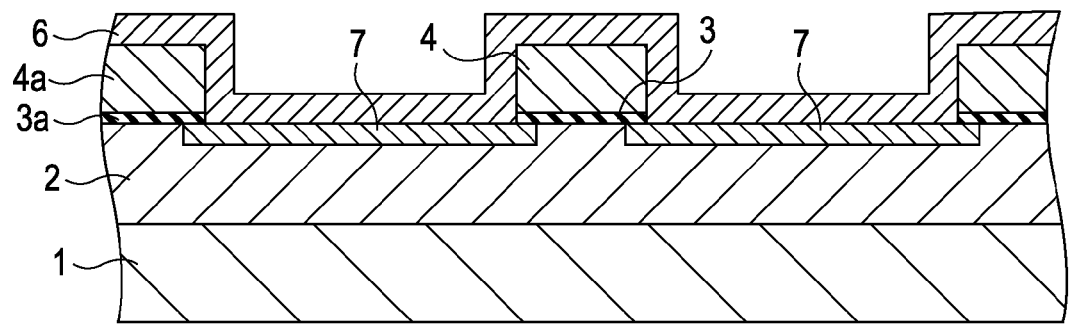
Figure 4:
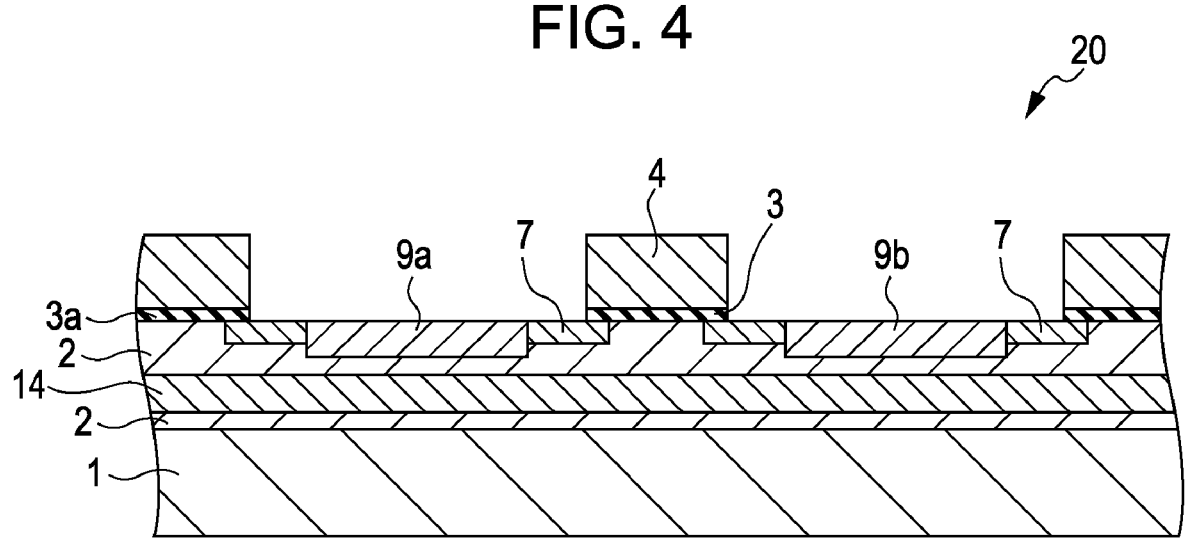
FIG. 4 is a cross-sectional view showing a power MOSFET incorporated in a semiconductor device according to another embodiment.

As shown in FIG. 3D, dry etching is performed using the resist mask 5 followed by ashing to remove unneeded portions of the polysilicon film 4a to thereby form the gate electrode 4. The $SiO_2$ film lying between the gate electrode 4 and the well region 2 functions as the gate insulating film 3.

Referring to FIG. 3D, a $SiO_2$ film not shown in the drawing is formed to completely cover the exposed portion of the well region 2 and the surface of the gate electrode 4 by CVD, and then phosphorus (P) ions are implanted through $SiO_2$ film to form a LDD film 7 and boron ions are implanted to form a PKT film not shown in the drawing.

In the process described above, the phosphorus ions are implanted at a dosage of 2.00 E+13 by 20 keV energy, and the boron ions are implanted at a dosage of 8.48 E+12 by 40 keV energy. The boron ions are implanted at an angle of 45° with respect to the Si substrate 1.

Figure 3F:
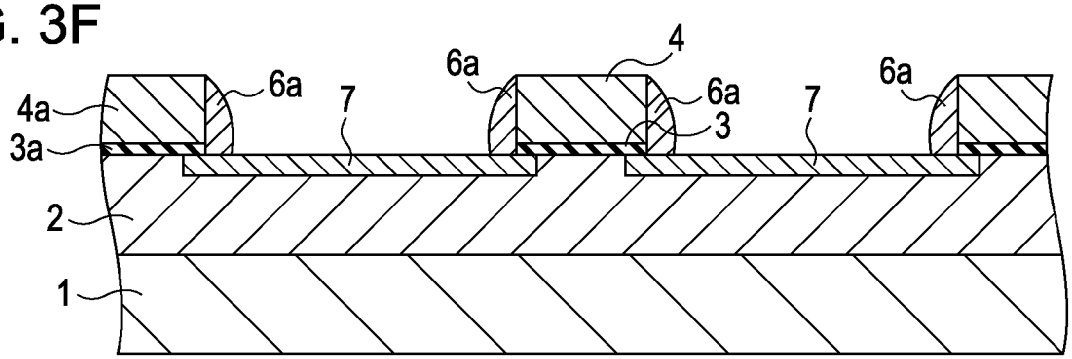

A $SiO_2$ film 6 is formed by CVD and etched back by anisotropic dry etching as shown in FIG. 3F to form side walls 6a on the side surfaces of the gate electrode 4.

Figure 3G:
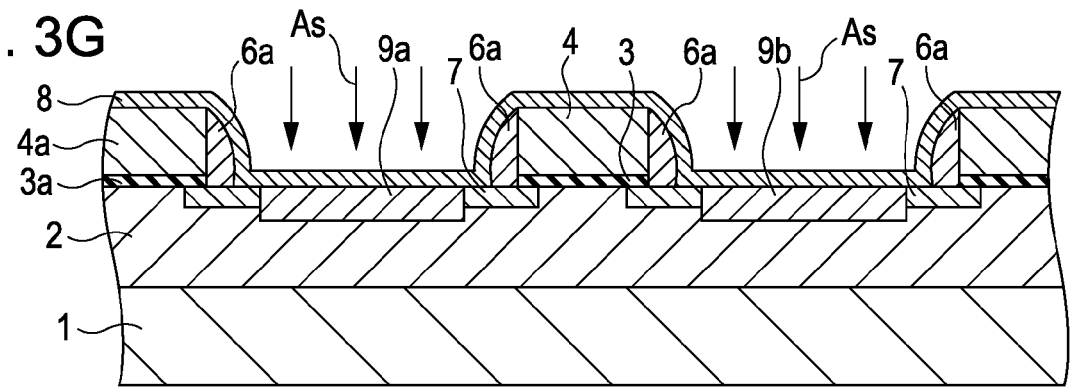

As shown in FIG. 3G, a $SiO_2$ film 8, whose portions on the side walls 6a serve to enable alignment to further reduce the line width and which serves as a protective film during ion implantation for forming a source region 9a and a drain region 9b is formed by CVD, and ions of N-type impurity, arsenic are implanted through the $SiO_2$ film 8 to form the source region 9a and the drain region 9b.

During this process, the arsenic ions are implanted at a dosage of 5.00 E+15 by 50 keV energy to form the source region 9a and the drain region 9b.

Lastly, the $SiO_2$ film 8 and the side walls 6a are removed to obtain a power MOSFET shown in FIG. 1.

A power MOSFET according to another embodiment of the present invention will now be described with reference to FIGS. 4 to 6H. In a power MOSFET 20 shown in FIGS. 4 to 6H, the components similar to those shown in FIGS. 1 to 3G are represented by the same reference numerals and the descriptions thereof are omitted.

As shown in FIG. 4, the power MOSFET 20 is similar to the power MOSFET 10 shown in FIG. 1 in its basic structure and that the well region 2 is made of an epitaxial layer but differs from the power MOSFET 10 in that the well region 2 made of the epitaxial layer includes an impurity layer 14 of a first conductivity type having a different impurity concentration.

In other words, the power MOSFET 20 includes the impurity layer 14, which is made of an epitaxial layer having a higher P-type impurity concentration than the well region 2, inside the P-type well region 2.

The impurity layer 14 inside the P-type well region 2 has a resistance lower than the resistance in the P-type well region 2 since the impurity layer 14 has a higher P-type impurity concentration than the P-type well region 2.

Thus, when the power MOSFET 20 is evaluated by UIS, a region having a resistance lower than that in the power MOSFET 10 shown in FIG. 1 can be formed under the gate electrode 4, which is the base of the parasitically formed NPN-type bipolar transistor.

As a result, during evaluation of the power MOSFET 20 by UIS, the parasitically formed NPN-type bipolar transistor is prevented from being turned ON despite supply of electric current, which is larger than the electric current that would break the power MOSFET 10, to the drain region of the power MOSFET 20 via a coil.

This shows that the rated current and the rated voltage of the power MOSFET 20 of this embodiment are higher than the power MOSFET 10 shown in FIG. 1.

Figure 5A:
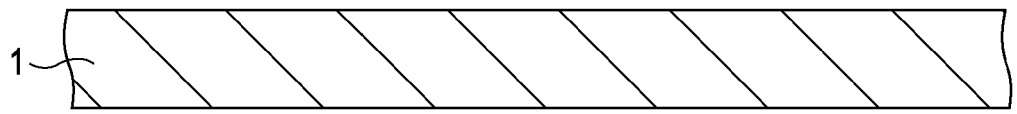
FIGS. 5A to 5D are cross-sectional views showing a process of making the power MOSFET.
Figure 5B:
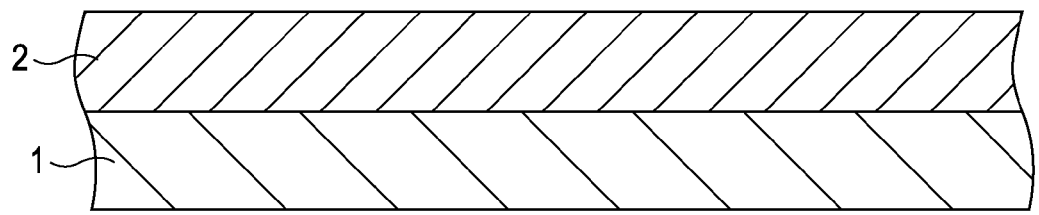

A method for making the power MOSFET 20 shown in FIG. 4 will now be described. In making the power MOSFET 20, as shown in FIG. 5A, a Si substrate 1 containing a P-type impurity at a relatively low concentration is prepared, and then, as shown in FIG. 5B, an epitaxial layer containing a P-type impurity at a concentration higher than the P-type impurity concentration in the Si substrate 1 is formed on the Si substrate 1 to thereby form the P-type well region 2.

During this process, the P-type well region 2 is made by gas-phase epitaxy using silicon as material gas while supplying boron as doping gas.

Subsequently, in order to set the threshold voltage that determines the switching characteristics of the power MOSFET 20, a $SiO_2$ film not shown in the drawing is formed on the surface of the P-type well region 2, and boron ions are implanted at a dosage of 5.00 E+12 ion/$cm^2$ into the P-type well region 2 through this $SiO_2$ film by using 70 keV energy.

Figure 5C:
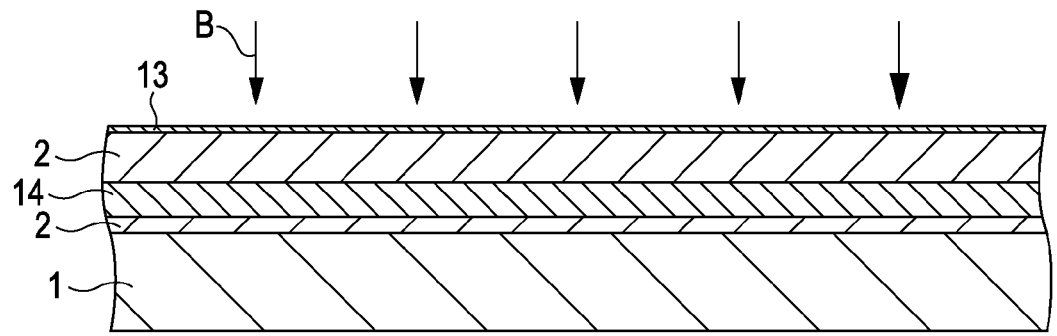

Next, as shown in FIG. 5C, a $SiO_2$ film 13 is formed on the surface of the P-type well region 2 by CVD, and ions of a P-type impurity, namely boron, are implanted into the interior of the P-type well region 2 through the $SiO_2$ film 13 to form an epitaxial impurity layer 14 having a P-type impurity concentration higher than that in the P-type well region 2. As a result, a P-type well region 2 constituted from a plurality of epitaxial layers with different impurity concentrations is made.

In other words, in the power MOSFET 20, the impurity concentration in the impurity layer 14 is higher than that in other layers constituting the P-type well region 2, and the resistance of the impurity layer 14 is lower than that in the other layers constituting the P-type well region 2.

In FIG. 5C, the impurity layer 14 is distinctively depicted from the P-type well region 2 to clearly show the presence of the impurity layer 14; however, in the power MOSFET 20, the region including the impurity layer 14 shown in FIG. 5C and the two layers located above and below the impurity layer 14 functions as a well region.

During this process of forming the impurity layer 14, the boron ions are implanted at a dosage of 6.00 E+12 ion/$cm^2$ using 190 keV energy.

Figure 5D:
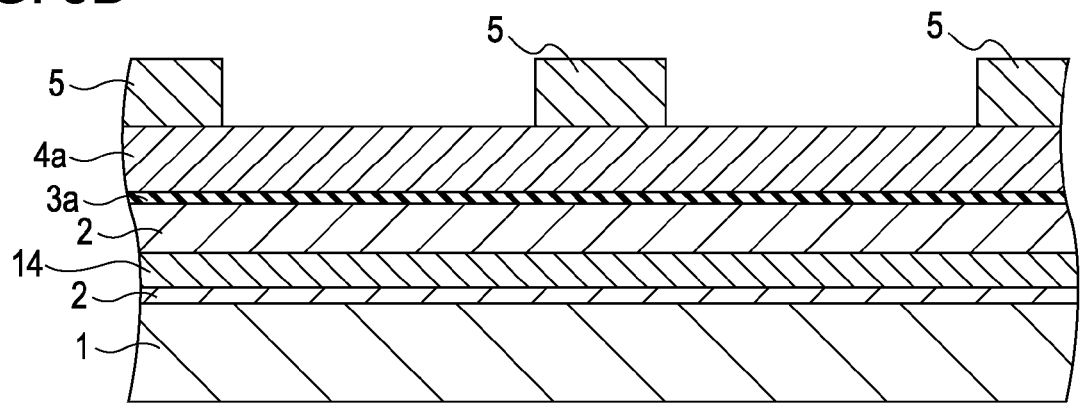

Referring now to FIG. 5D, a $SiO_2$ film 3a which later makes a gate insulating film 3 is formed on the upper surface of the P-type well region 2 by CVD, and a polysilicon film 4a which later makes a gate electrode 4 is formed on the upper surface of the $SiO_2$ film 3a also by CVD.

A photoresist is applied on the surface of the polysilicon film 4a and subjected to predetermined photolithographic patterning to form a resist mask 5 on the surface of the polysilicon film 4a in a portion that will later make the gate electrode 4.

Figure 6E:
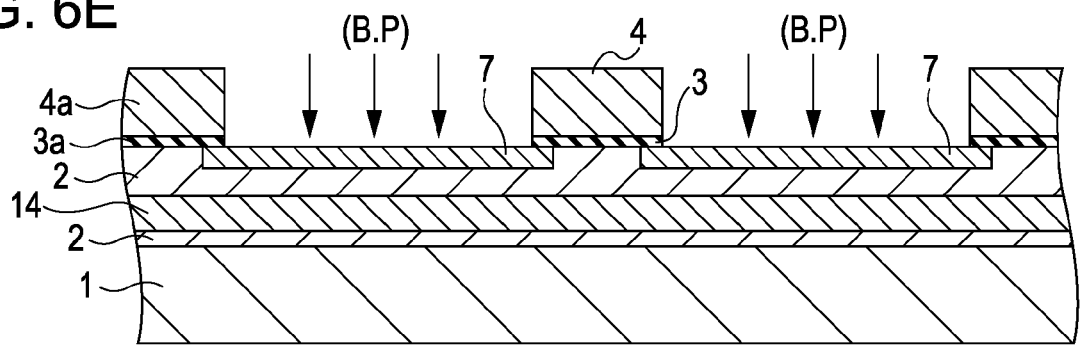
FIGS. 6E to 6H are cross-sectional views showing the process making the power MOSFET.
Figure 6F:
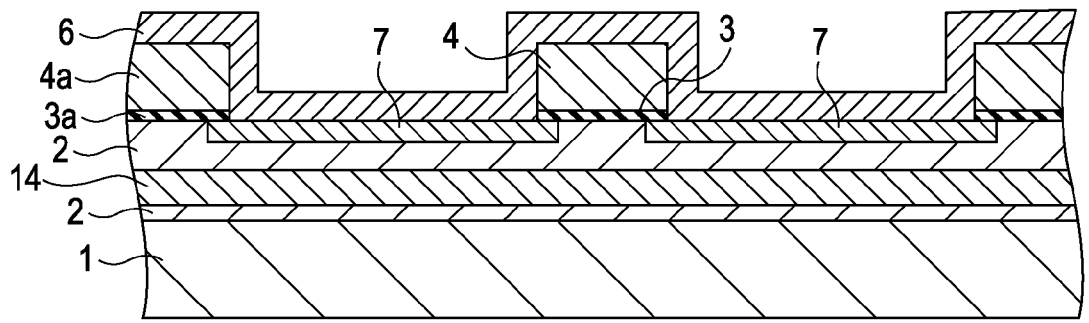
Figure 6G:
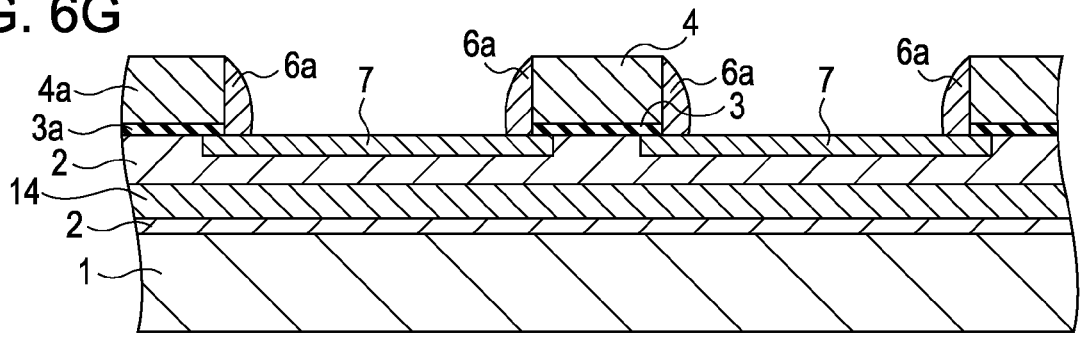

Next, as shown in FIG. 6E, dry etching is performed using the resist mask 5, followed by ashing to remove unneeded portions of the polysilicon film 4a to thereby form the gate electrode 4. The $SiO_2$ film that lies between the gate electrode 4 and the P-type well region 2 serves as the gate insulating film 3.

As shown in FIG. 6E, after a $SiO_2$ film not shown in the drawing is formed to completely cover the exposed surface of the P-type well region 2 and the surface of the gate electrode 4 by CVD, phosphorus ions are implanted through the $SiO_2$ film to form a LDD film 7 and then boron ions are implanted to form a PKT film not shown in the drawing.

In the process described above, the phosphorus ions are implanted at a dosage of 2.00 E+13 by 20 keV energy, and boron ions are implanted at a dosage of 8.48 E+12 by 40 keV energy. The boron ions are implanted at an angle of 45° with respect to the Si substrate 1.

A $SiO_2$ film 6 (see FIG. 6G) is formed by CVD and etched back by anisotropic dry etching as shown in FIG. 3F to form side walls 6a on the side surfaces of the gate electrode 4.

Figure 6H:
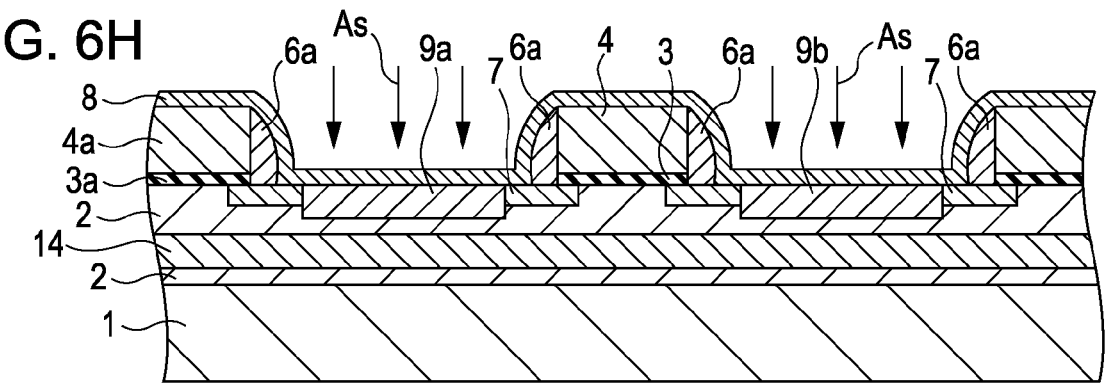

As shown in FIG. 6H, a $SiO_2$ film 8, whose portions on the side walls 6a serve to enable alignment to further reduce the line width and which serves as a protective film during ion implantation for forming a source region 9a and a drain region 9b is formed by CVD, and ions of N-type impurity, arsenic are implanted through the $SiO_2$ film 8 to form the source region 9a and the drain region 9b.

During this process, the arsenic ions are implanted at a dosage of 5.00 E+15 by 50 keV energy to form the source region 9a and the drain region 9b.

Lastly, the $SiO_2$ film 8 and the side walls 6a are removed to obtain the power MOSFET 20 shown in FIG. 4.

According to the power MOSFET 10 of an embodiment, because the region below the gate electrode 4, which serves as the base of the parasitically formed NPN-type bipolar transistor during evaluation by UIS (the region between the source region 9a and the drain region 9b in the P-type well region 2), is made of an epitaxial layer containing a P-type impurity, the impurity concentration in the portion that serves as the base of the parasitically formed NPN-type bipolar transistor can be made uniform, and the resistance in this portion can be reduced to improve the UIS characteristics.

According to the power MOSFET 20 of another embodiment, since the impurity layer 14 having a higher P-type impurity concentration is provided inside the P-type well region 2, the resistance in the portion serving as the base of the parasitically formed NPN-type bipolar transistor can be further reduced. Thus, the UIS characteristics can be further improved.

In addition, other characteristics such as Vth of the power MOSFET remain intact despite formation of the well region 2 as above.

The UIS characteristics of the power MOSFET can be further improved by a modification that provides a P-type (first conductivity type) impurity region having an impurity concentration higher than that in the well region 2 other than the impurity layer 14, the P-type impurity region being disposed between the impurity layer 14 and the source region.

FIG. 8 is a cross-sectional view of a power MOSFET 20a according to a modification of the embodiment shown in FIG.

4. As shown in FIG. 8, the power MOSFET 20a has the same structure as the power MOSFET 20 shown in FIG. 4 except that an impurity region 9c containing a P-type impurity at a concentration higher than that in the well region 2 is provided between the impurity layer 14 and the source region 9a.

The impurity region 9c can be formed by selectively implanting ions of boron (P-type impurity) into a surface portion of the source region 9a near the gate electrode 4 after the source region 9a is formed in the process of making the power MOSFET 20a.

In particular, the impurity region 9c is formed by implanting boron ions at a dosage of $2.00\ E+14$ ion/cm$^2$ using 140 keV energy and then implanting boron ions at a dosage of $2.00\ E+15$ ion/cm$^2$ using 40 keV energy.

When the impurity region 9c having a higher P-type impurity concentration than in the P-type well region 2 is provided between the impurity layer 14 and the source region 9a, the difference in potential between the impurity region 9c serving as an emitter and the impurity layer 14 below the gate electrode 4 serving as a base of the parasitically formed NPN-type bipolar transistor (transistor shown by a circuit symbol in FIG. 8) during evaluation of the power MOSFET 20a by UIS can be decreased. Accordingly, the parasitically formed NPN-type bipolar transistor can be substantially prevented from being turned ON, and the UIS characteristics of the power MOSFET 20a can thereby be further improved.

It should be understood by those skilled in the art that various modifications, combinations, sub-combinations and alterations may occur depending on design requirements and other factors insofar as they are within the scope of the appended claims or the equivalents thereof.

What is claimed is:

1. A metal oxide semiconductor field effect transistor comprising:
    a semiconductor substrate, the semiconductor substrate containing an impurity of a first conductivity type impurity;
    a well region containing an impurity of the first conductivity type on the semiconductor substrate, the well region including a source region and a drain region formed by adding an impurity of a second conductivity type, the source region and the drain region being separated from each other by a predetermined gap;
    an insulating film disposed on the surface of the well region in the gap between the source region and the drain region; and
    a gate electrode disposed on the insulating film,
    wherein,
        the impurity concentration of the well region is higher than the impurity concentration of the semiconductor substrate, and
        the well region is composed of an epitaxial layer, and the epitaxial layer includes an impurity layer therein, the impurity layer being of the first conductivity type and having an impurity concentration different than the other regions of the well region.

2. The metal oxide semiconductor field effect transistor according to claim 1, wherein the impurity concentration of the impurity layer is higher than that in other layers of the well region.

3. The metal oxide semiconductor field effect transistor according to claim 1 or 2, wherein the impurity layer is connected to the source region through an impurity region of a first conductivity type having an impurity concentration higher than that in the well region other than the impurity layer.

4. A semiconductor device comprising a metal oxide semiconductor field effect transistor including:
    a semiconductor substrate, the semiconductor substrate containing an impurity of a first conductivity type impurity;
    a well region containing an impurity of the first conductivity type on the semiconductor substrate, the well region including a source region and a drain region formed by adding an impurity of a second conductivity type, the source region and the drain region being separated from each other by a predetermined gap;
    an insulating film disposed on the surface of the well region in the gap between the source region and the drain region; and
    a gate electrode disposed on the insulating film,
    wherein,
        the impurity concentration of the well region is higher than the impurity concentration of the semiconductor substrate, and
        the well region is composed of an epitaxial layer, and the epitaxial layer includes an impurity layer therein, the impurity layer being of the first conductivity type and having an impurity concentration different than the other regions of the well region.

5. A method for making a metal oxide semiconductor field effect transistor including (1) a semiconductor substrate containing an impurity of a first conductivity type impurity, (2) a well region containing an impurity of the first conductivity type on the semiconductor substrate, the well region containing an impurity concentration that is higher than the impurity concentration of the substrate and including a source region and a drain region formed by adding an impurity of a second conductivity type, (3) the source region and the drain region being separated from each other by a predetermined gap, (4) an insulating film disposed on the surface of the well region in the gap between the source region and the drain region, and (5) a gate electrode disposed on the insulating film, the method comprising:
    forming an epitaxial layer containing the impurity of a first conductivity type on the semiconductor substrate; and
    doping the epitaxial layer with the impurity of the first conductivity type to form an impurity layer therein the impurity layer being the first conductivity type and having an impurity concentration different than the other regions of the well region.

* * * * *